United States Patent
Herr et al.

(10) Patent No.: US 11,417,821 B2
(45) Date of Patent: Aug. 16, 2022

(54) SUPERCONDUCTOR GROUND PLANE PATTERNING GEOMETRIES THAT ATTRACT MAGNETIC FLUX

(71) Applicants: Anna Y. Herr, Ellicott City, MD (US); Vladimir V. Talanov, Ellicott City, MD (US); Quentin P. Herr, Ellicott City, MD (US)

(72) Inventors: Anna Y. Herr, Ellicott City, MD (US); Vladimir V. Talanov, Ellicott City, MD (US); Quentin P. Herr, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 308 days.

(21) Appl. No.: 16/296,007

(22) Filed: Mar. 7, 2019

(65) Prior Publication Data
US 2020/0287118 A1  Sep. 10, 2020

(51) Int. Cl.
*H01L 39/14* (2006.01)
*H01L 39/08* (2006.01)
(Continued)

(52) U.S. Cl.
CPC .............. *H01L 39/14* (2013.01); *H01L 27/18* (2013.01); *H01L 39/08* (2013.01); *H01L 39/2403* (2013.01)

(58) Field of Classification Search
CPC ..... H01L 39/14; H01L 39/08; H01L 39/2403; H05K 1/0245; H05K 1/0253;
(Continued)

(56) References Cited

U.S. PATENT DOCUMENTS

| 3,429,032 A | 2/1969 | Martin et al. |
| 4,392,148 A | 7/1983 | Chang et al. |

(Continued)

OTHER PUBLICATIONS

S. Aull et al., "Trapped magnetic flux in superconducting niobium samples", Phys. Rev. ST Accel Beams, published Jun. 18, 2012, p. 062001, vol. 15, The American Physical Society, United States.

(Continued)

*Primary Examiner* — Steven T Sawyer
(74) *Attorney, Agent, or Firm* — Tarolli, Sundheim, Covell & Tummino LLP (57) ABSTRACT

Superconducting integrated circuit layouts are proofed against the detrimental effects of stray flux by designing and fabricating them to have one or more ground planes patterned in the x-y plane with a regular grid of low-aspect-ratio flux-trapping voids. The ground plane(s) can be globally patterned with such voids and thousands or more superconducting circuit devices and wires can thereafter be laid out so as not to intersect or come so close to the voids that the trapped flux would induce supercurrents in them, thus preventing undesirable coupling of flux into circuit elements. Sandwiching a wire layer between patterned ground planes permits wires to be laid out even closer to the voids. Voids of successively smaller maximum dimension can be concentrically stacked in pyramidal fashion in multiple ground plane layers having different superconductor transition temperatures, increasing the x-y area available for device placement and wire-up.

20 Claims, 5 Drawing Sheets

(51) Int. Cl.
*H01L 39/24* (2006.01)
*H01L 27/18* (2006.01)

(58) Field of Classification Search
CPC ............... H05K 1/0224; H05K 1/0237; H05K 2201/09236; H05K 2201/09681; H05K 2201/0969
See application file for complete search history.

(56) References Cited

U.S. PATENT DOCUMENTS

| | | | |
|---|---|---|---|
| 6,042,998 A | 3/2000 | Brueck et al. | |
| 6,184,477 B1 * | 2/2001 | Tanahashi | H01L 23/50 174/261 |
| 6,303,871 B1 * | 10/2001 | Zu | H01L 23/49838 174/250 |
| 6,831,233 B2 * | 12/2004 | Wood | H01L 23/49822 174/250 |
| 2001/0010270 A1 * | 8/2001 | Lin | H05K 1/0224 174/255 |
| 2003/0128532 A1 * | 7/2003 | Somei | H01Q 1/247 361/777 |
| 2012/0115077 A1 * | 5/2012 | Wu | G03G 5/0564 430/58.35 |
| 2014/0182891 A1 * | 7/2014 | Rengarajan | H05K 1/0222 174/251 |
| 2015/0053460 A1 * | 2/2015 | Kunimoto | H05K 3/4602 174/251 |

OTHER PUBLICATIONS

B. Chiaro et al., "Dielectric surface loss in superconducting resonators with flux-trapping holes", Superconductor Science and Technology, Jan. 2, 2017, p. 104006, vol. 29, No. 10, IOP Publishing, United States.

Quentin P. HERR et al., "Reproducible operating margins on a 72800-device digital superconducting chip", Superconductor Science and Technology, Oct. 28, 2015, p. 124003, vol. 28, No. 12, IOP Publishing, United States.

Vasili K. Semenov, "AC-Biased Shift Registers as Fabrication Process Benchmark Circuits and Flux Trapping Diagnostic Tool", IEEE Transactions on Applied Superconductivity, Jun. 2017, p. 1301409, vol. 27, No. 4, IEEE, United States.

Vasili K. Semenov, "How Moats Protect Superconductor Films From Flux Trapping", IEEE Transactions on Applied Superconductivity, Apr. 2016, p. 1300710, vol. 26, No. 3, IEEE, United States.

Gheorghe Stan et al., "Critical Field for Complete Vortex Expulsion from Narrow Superconducting Strips", Physical Review Letters, Mar. 5, 2004, p. 097003-1 vol. 92, No. 9, The American Physical Society, United States.

* cited by examiner

SUPERCONDUCTOR GROUND PLANE PATTERNING GEOMETRIES THAT ATTRACT MAGNETIC FLUX

TECHNICAL FIELD

The present invention relates generally to quantum and classical digital superconducting circuits, and specifically to superconductor ground plane patterning geometries that attract magnetic flux.

BACKGROUND

In superconductive circuitry including a superconducting ground plane, the cooldown to cryogenic temperatures needed for superconducting operation can result in formation of magnetic flux vortices in undesirable circuit locations. In particular, flux vortices tend to form in a ground plane based on residual magnetic field, which can be made low but not zero. When flux quantizes, it concentrates the residual magnetic field. Absent some way of attracting and sequestering flux, the locations of flux vortex formation are random and unpredictable from one cooldown to another. When coupled into superconducting circuitry, flux vortices create harm by shifting thresholds in a superconducting circuit, e.g., by placing undesired supercurrent into a loop that includes an inductor that forms part of a logic mechanism. The result of such coupling can be defective functioning of the superconducting digital circuit.

A ground plane can be patterned with voids to trap magnetic flux. So patterned, it is energetically favorable for trapped flux to not just end up in random circuit locations, but to be sequestered in the fabricated voids. Such voids are typically patterned as long, skinny "moats" that cut through a superconducting ground plane (when viewed in a plan view of an x-y plane corresponding to the orientation of the ground plane) and extend along a perimeter surrounding Josephson circuit devices. Such moats are generally continuous except for small regions so as to preserve the contiguity of the ground plane.

The term "x-y routing" refers to the layout design in the x-y plane of superconducting wires between discrete devices in a superconducting integrated circuit (IC).

SUMMARY

One example includes a superconducting digital integrated circuit (IC) having a ground plane fabricated at least in part as a blanket deposition (e.g., over an x-y plane) of a superconducting metal. The ground plane is patterned (e.g., in the x-y plane) with a regular grid of dielectric-filled flux-trapping voids, each void in the grid being generally radially symmetrical in shape (e.g., having an aspect ratio of less than 2:1 in any direction on the x-y plane, e.g., having an aspect ratio of about 1:1). The IC also has, fabricated on one or more layers above the ground plane, discrete circuit devices (e.g., more than a thousand discrete circuit devices) interconnected by superconducting wires. The devices are placed, and the wires are routed between the voids (e.g., when viewed in a plan view of the x-y plane, though not necessarily in the z dimension), such that the devices and wires do not intersect any of the voids (in the plan view) and maintain a predetermined distance away from each of the voids (as viewed in the plan view). The devices and wires form at least one active digital circuit. The voids are configured to protect the at least one active digital circuit from parasitic flux bias by attracting and sequestering stray flux such that it cannot couple flux to the devices or wires.

Another example includes a method of designing a superconducting digital integrated circuit (IC). The design method includes designing a ground plane patterned (e.g., in an x-y plane) with a regular grid of dielectric-filled, flux-trapping voids, each void in the grid being generally radially symmetrical in shape (e.g., having an aspect ratio of less than 2:1 in any direction on the x-y plane, e.g., having an aspect ratio of about 1:1), at least in part by selecting a maximum dimension (e.g., x-y dimension) of each void in the grid as less than or equal to a maximum distance from a possible stray location on the ground plane to a nearest void edge. After designing the ground plane, one or more layers above the ground plane are designed to have discrete circuit devices (e.g., more than a thousand discrete circuit devices) interconnected by superconducting wires, at least in part by choosing the placement of the devices and the routing of the wires (e.g., in a plan view of the x-y plane) such that the devices and wires do not intersect any of the voids and maintain a predetermined distance away from each of the voids (e.g., as viewed in the plan view). The devices and wires form at least one active digital circuit. The voids are configured to protect the at least one active digital circuit from parasitic flux bias by attracting and sequestering stray flux such that it cannot couple flux to the devices or wires.

Yet another example includes a method of fabricating a superconducting digital integrated circuit (IC). The fabrication method includes fabricating a ground plane patterned (e.g., in an x-y plane) with a regular grid of dielectric filled, flux-trapping voids, each void in the grid being generally radially symmetrical in shape (e.g., having an aspect ratio of less than 2:1 in any direction on the x-y plane, e.g., having an aspect ratio of about 1:1), at least in part by fabricating each void in the grid as having a maximum dimension (e.g., x-y dimension) less than or equal to a maximum distance from a possible stray location on the ground plane to a nearest void edge. One or more layers are fabricated above the ground plane to have discrete circuit devices (e.g., more than a thousand discrete circuit devices) interconnected by superconducting wires, the devices being placed and wires being routed (e.g., in a plan view of the x-y plane) between the voids, such that the devices and wires do not intersect any of the voids and maintain a predetermined distance away from each of the voids, the devices and wires forming at least one active digital circuit. The voids are configured to protect the at least one active digital circuit from parasitic flux bias by attracting and sequestering stray flux such that it cannot couple flux to the devices or wires.

Still another example includes a superconducting digital integrated circuit (IC) having first and second ground planes each fabricated at least in part as a blanket deposition of a superconducting metal and each being patterned with a regular grid of dielectric-filled flux-trapping voids, at least some of the voids of the second ground plane each having a corresponding concentric void of the first ground plane, the maximum dimension (e.g., maximum x-y dimension) of each second-ground-plane void being less than the maximum dimension (e.g., maximum x-y dimension) of the corresponding first-ground-plane void. The IC further includes one or more device layers above the ground planes, the one or more device layers comprising discrete circuit devices (e.g., more than a thousand discrete circuit devices) interconnected by superconducting wires, the devices being placed and wires being routed between individual voids in the regular grid, such that the devices and wires do not intersect any of the voids (e.g., in the plan view) and maintain at least a predetermined distance away from any of the voids, the devices and wires forming at least one active digital circuit. The voids are configured to protect the at least one active digital circuit from parasitic flux bias by attracting and sequestering stray flux such that it cannot couple flux to the devices or wires.

DETAILED DESCRIPTION

The failure mechanism of flux trapping has heretofore posed an impediment to creation of very large digital superconducting circuits, with "very large" here used in the VLSI (very large systems integration) sense, i.e., in circuits involving more than a thousand discrete devices, more typically millions of devices, sometimes hundreds of millions of devices or more. Mitigation of flux trapping in superconductor integrated circuits (ICs) has historically involved patterning of the ground plane following the layout of functional circuit components in order to sequester flux in known locations. Fluxes that are not successfully sequestered, called strays, can degrade or preclude correct circuit operation by, for example, inducing supercurrent into circuit components and thereby breaking the logical operation provided by those components.

The problem of strays has been approached, but never completely solved, by equipping superconducting IC ground planes with moats. Generally, long moats must be less than twenty micrometers apart to be effective at sequestering flux. Because superconducting circuit components and the wires that interconnect them cannot cross or be placed too close to such moats, and further because the moats are of high x-y-plane aspect ratio or nearly completely surround circuits or components, moats obstruct x-y routing and/or leave digital circuit components vulnerable to flux coupling that can cripple circuit functionality. Such moats therefore pose both routing challenges and are less than completely effective at avoiding flux coupling. Undesired supercurrents induced in circuit loops as a result of coupled flux can potentially be burned off using milliohm resistances placed in series in such loops, but this approach may have other drawbacks.

The present disclosure describes a new way of designing or fabricating superconducting circuit layouts proofed against the detrimental effects of stray flux. Whereas, conventionally, a layout of functional circuit components and wires would be designed first and moats or other voids would be laid out in available space around the components, this disclosure describes a new approach in which a grid of voids is laid out first and the functional circuit components are thereafter laid out in the grid in the spaces between voids.

In the circuits and methods described herein, instead of a superconducting ground plane being equipped with moats that are long and skinny or otherwise surround circuits or components in space leftover after layout, one or more superconducting ground planes are substantially uniformly patterned with flux-sequestering voids, of comparatively low x-y-plane aspect ratio, that can made be comparatively much smaller, e.g., smaller than the intervoid distance. Such patterning can thereby be made using geometries of relevance to x-y routing, greatly improving the ability to route superconducting wires connecting circuit components, while still providing effective flux-sequestering coverage of a ground plane. As examples, instead of voids having to be placed twenty micrometers apart, the voids can be placed between about ten and about twelve micrometers apart in the x-y plane (i.e., measured as center-to-center spacing). At the same time, the voids can be made optimally small, thereby preserving circuit active area. The present disclosure describes use of void geometries where minimum void spacing is greater than or comparable to void size in both x and y dimensions. The present disclosure further describes a scaling law for effective void geometries in this regime. The present disclosure still further describes the use of a multistage ground plane, and of annular voids that provide through-vias for superconductive connections.

A ground plane is a substantially continuous layer of superconducting metal (e.g., niobium), as may be fabricated by blanket deposition, much larger in x- and y-dimension area than in z-dimension thickness, which may be floating or may be in electrical contact with other circuit components. For example, a ground plane may have a thickness of between about twenty and one thousand nanometers, e.g., between about one hundred and five hundred nanometers, e.g., between about two hundred nanometers and about three hundred nanometers. Just as superconducting metal can be patterned to make wires, a ground plane can be patterned with voids that are filled with a dielectric used in the fabrication process (e.g., silicon dioxide or silicon nitride). Voids can be patterned in a ground plane using, for example, either a conventional metallization process involving a metal etch, or a damascene process, in which a dielectric pillar is patterned at the location of each void, followed by a blanket deposition of superconducting metal such as niobium and a planarization step using, e.g., a polish technique (e.g., using chemical-mechanical planarization).

Sequestration of flux in a void results in a persistent supercurrent that circulates around a periphery of the void. The magnitude of the current is inversely proportional to the inductance of the void, which in turn is proportional to the diameter of the void, such that larger void diameters have less sequestered flux current, but the range of the current extends to a greater area.

Figure 1:
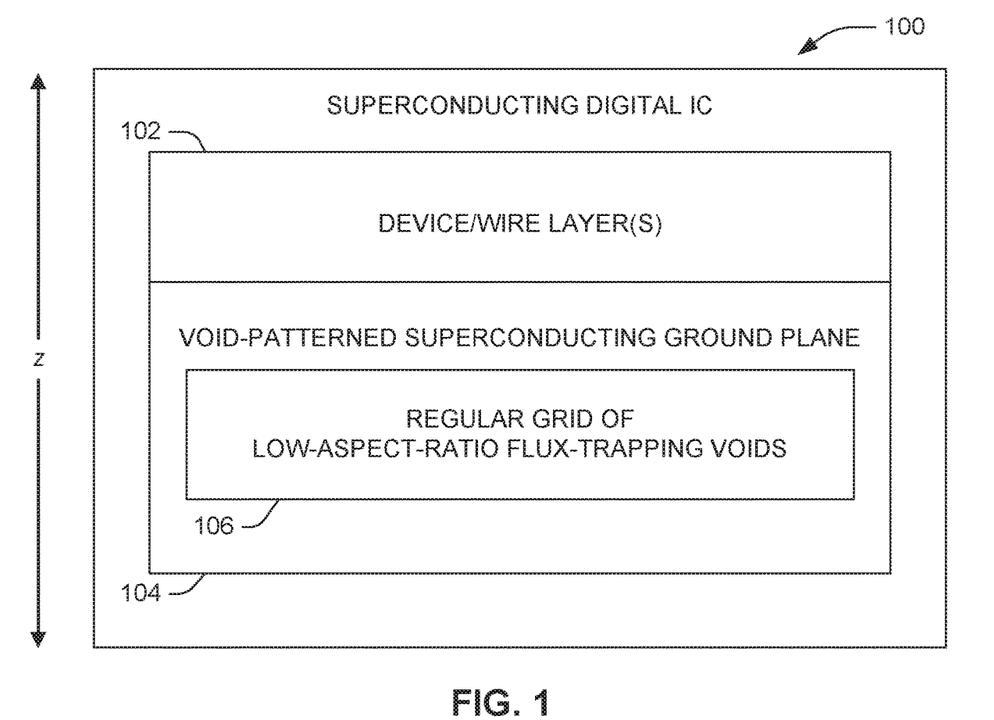
FIG. 1 is a block diagram of an example superconducting digital IC with a void-patterned superconducting ground plane.

FIG. 1 illustrates an example superconducting digital IC 100 made up of a number of layers, e.g., layers 102, 104, and possibly others. IC 100 can include, for example, more than a thousand discrete circuit devices interconnected by superconducting wires fabricated on one or more layers 102 above a void-patterned superconducting ground plane 104. Ground plane 104 can be fabricated at least in part as a blanket deposition, over an x-y plane, of a superconducting metal. Ground plane layer 104 can, for example, have a z-dimension thickness of between about two hundred nanometers and about three hundred nanometers. Ground plane 104 is patterned in the x-y plane with a regular grid 106 of dielectric-filled flux-trapping voids. In some examples, the voids can be made to each be a vacuum, rather than being filled with any dielectric matter, and therefore, in the context of the present application, the term "dielectric-filled" should be construed as encompassing such examples where the voids contain no matter at all, or in which they contain some mix of dielectric matter and vacuum, as for example, with a dielectric annulus surrounding a vacuum pocket. The term "dielectric-filled" should further be construed as encompassing, for the purposes of the present application, such examples where the voids are made of a non-superconducting metal, such as copper (Cu) or gold (Au). The term "dielectric-filled" should further be construed as encompassing, for the purposes of the present application, such examples where the voids are made of a superconductor, such as aluminum (Al) or tin (Sn), with a critical temperature (i.e., a temperature at which the void material becomes superconducting) that is less than that of the primary superconductor, such as niobium (Nb) or niobium nitride (NbN) of which the ground plane comprising the voids is made. Each void in grid 106 can have a low aspect ratio. As an example, each void in grid 106 can have an aspect ratio of less than 2:1 in any direction on the x-y plane. For example, each void in grid 106 can have an aspect ratio of substantially 1:1. In some examples, voids in grid 106 can be generally radially symmetrical. For example, each void in grid 106 can be a regular polygon, e.g., a triangle, a square, a pentagon, a hexagon, an octagon, a circle, or a star.

In the superconducting IC 100 of FIG. 1, the circuit devices are placed and the interconnecting wires are routed, in a plan view of the x-y plane, in the intervoid space, i.e., between the voids as viewed from the plan view but not necessarily in the same plane as the voids, since the voids are in the ground plane 104 and the devices and wires are in other layer(s) 102. The devices are placed and the interconnecting wires are routed such that the devices and wires do not intersect any of the voids (as viewed in the plan view) and maintain a predetermined distance away from each of the voids (as viewed in the plan view). The devices and wires form at least one active digital circuit. The voids are configured to protect the at least one active digital circuit from parasitic flux bias by attracting and sequestering stray flux such that it cannot couple flux to the devices or wires.

In some examples, a maximum x-y size dimension of each void (e.g., a maximum diameter of each void) in the grid is less than or equal to a maximum distance from a possible stray location on the ground plane to a nearest void edge. In some examples, the maximum x-y size dimension of each void in the grid is between about one fifth of a micrometer and about ten micrometers. In some examples, the maximum distance from a possible stray location on the ground plane to a nearest void edge is between about one half of a micrometer and about ten micrometers. In some examples, the minimum center-to-center spacing between the voids (i.e., as viewed in the x-y plane) is between about five micrometers and about twenty micrometers, e.g., between about ten micrometers and about twelve micrometers.

Figure 2:
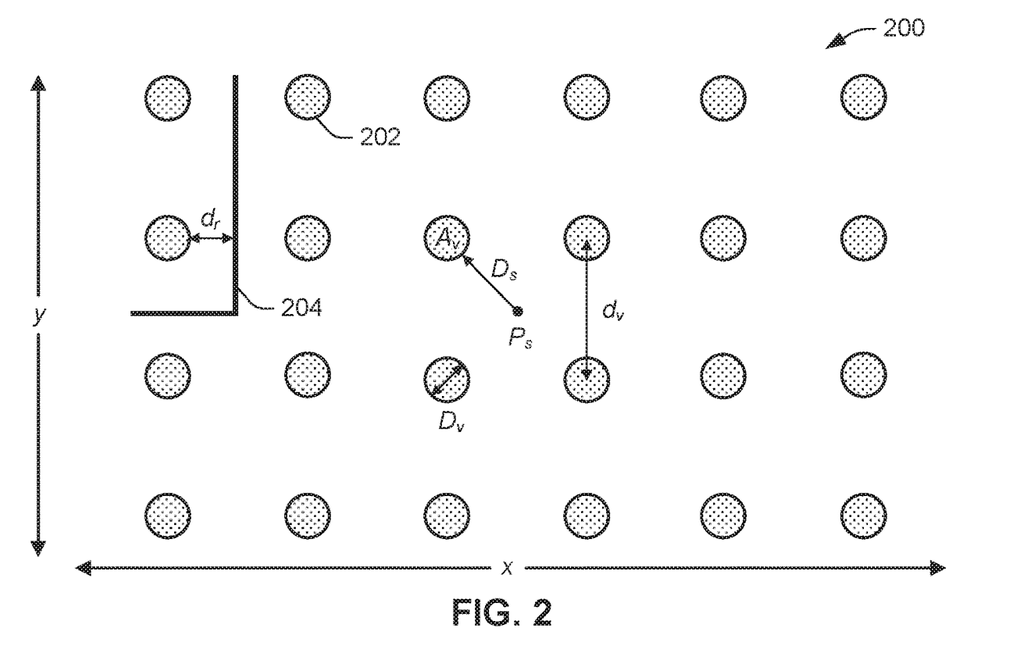
FIG. 2 is an x-y-plane void pattern diagram showing an example grid pattern for a void-patterned superconducting ground plane.

FIG. 2 illustrates an example patterning geometry 200 of flux-sequestering voids 202 in an x-y plane, where the maximum x-y size dimension $D_v$ (herein called the "characteristic void size" or "diameter") of each void 202 is less than the distance $d_v$ between voids, e.g., less than or equal to a maximum distance $D_s$ from a possible stray location $P_s$ on the ground plane to a nearest void edge. The patterning geometry 200 of FIG. 2 can thus correspond to the patterning used in ground plane 104 of FIG. 1. Although patterning geometry 200 is illustrated as having a square grid, any regular lattice arrangement of voids 202 having a periodic structure can be used, e.g., triangular, honeycomb, etc. A square grid has the advantage of facilitating x-y wiring placement ("wire-up"). Also, although the illustrated void geometry in FIG. 2 uses voids 202 that are circular in shape, the voids 202 can be any shape, e.g., regular polygons, squares, rectangles, ovals, stars, etc.

For an x-y array of voids 202, the entire intervoid space, i.e., the region between the voids 202, is guarded from stray flux provided that the maximum distance $D_s$ from any one void edge is sufficiently small, as determined by the characteristic void size $D_v$. As examples, the voids 202 can each have characteristic void size $D_v$ of between about one and about five micrometers, e.g., about three micrometers, on a square grid of void distance $d_v$ of between about ten and about fifteen micrometers on the side, e.g., an about twelve-micrometer-by-twelve-micrometer square grid. In some other examples, not illustrated, the voids 202 can be laid out in an about equilateral triangular grid where void distance $d_v$ is between about ten micrometers and fifteen micrometers, e.g., about twelve micrometers. As indicated previously, a square grid can provide x-y routing layout advantages over a triangular grid by simplifying wire-up between devices as needing only straight wire lines as opposed to wire lines that would need to zig-zag through a triangular void grid pattern.

A figure of merit (FOM) of approximately the void area divided by the center-to-center void distance ($\sim A_v/d_v$) provides a scaling guide that affords a comparison of the effectiveness of different regular patterning geometries like geometry 200 laid out in FIG. 2. That is, the FOM for stray probability approximately scales proportionally with void area $A_v$, and inversely proportionally with minimum void spacing $d_v$. A geometry with a larger FOM ratio will have better flux sequestration performance than a geometry with a comparatively smaller FOM ratio. As noted above, the voids 202 themselves can be of any shape (square, circle, rectangle, etc.), but in some examples are shaped to have a small aspect ratio in the x-y plane, e.g., an aspect ratio of less than 2:1 in any direction on the x-y plane.

In summary and with reference to FIG. 2, $$D_v \leq D_s,$$

$$FOM \sim A_v/d_v,$$

$D_s$ is the maximum distance from a possible stray location to the nearest void edge, with example values $0.5 \ \mu m \leq D_s \leq 10 \ \mu m$, $D_v$ is the void diameter, with example values $0.2 \ \mu m \leq D_v \leq 10 \ \mu m$, $A_v$ is the void area, and $d_v$ is the minimum void spacing between voids (as measured center-to-center).

Figure 3:
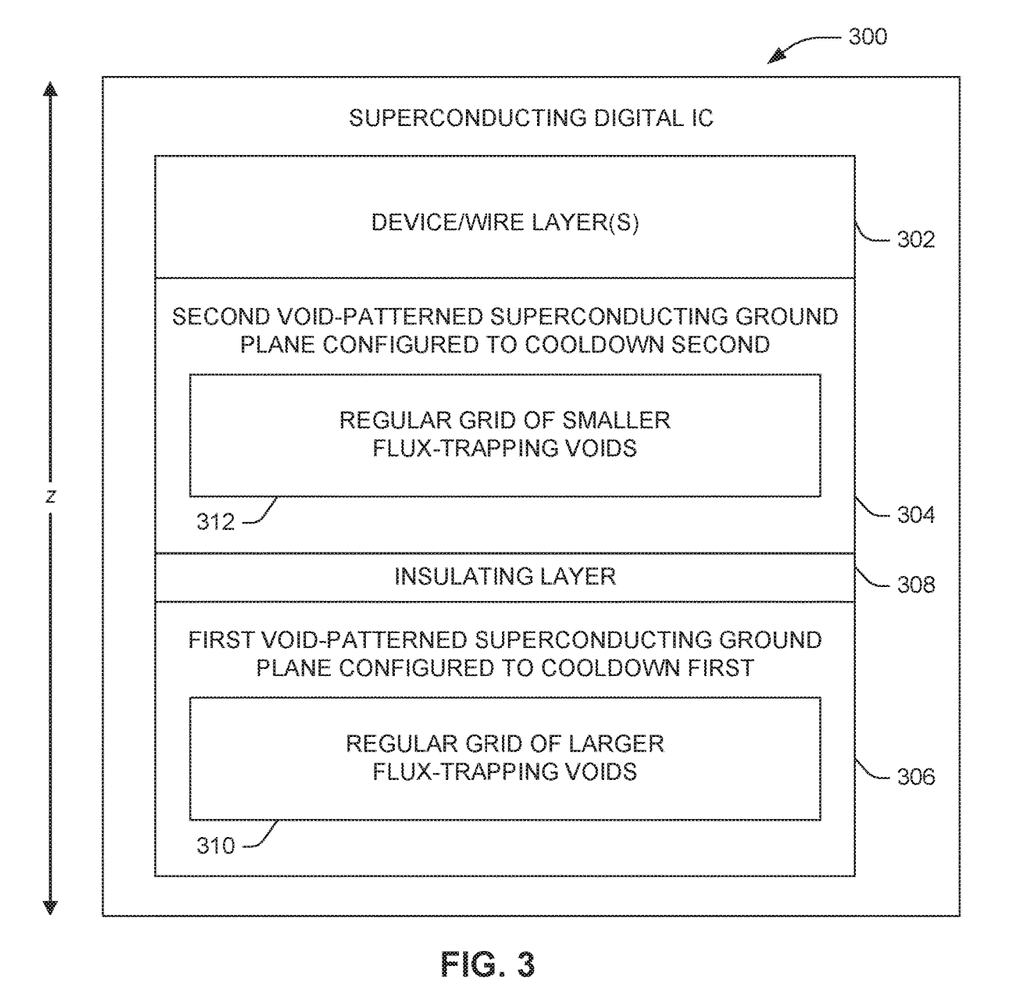
FIG. 3 is a block diagram of an example superconducting digital IC with multiple void-patterned superconducting ground planes.

Effective void patterning geometries can be applied sequentially to multiple ground planes, or to a single ground plane with multiple stages. FIG. 3 illustrates an example superconducting digital IC 300 having multiple ground planes 304, 306. IC 300 in FIG. 3 can include, for example, more than a thousand discrete circuit devices interconnected by superconducting wires fabricated on one or more layers 302 above multiple void-patterned superconducting ground planes 304, 306. As illustrated in FIG. 3, these ground planes can be separated by an insulating layer 308, but in other examples, not illustrated, the multiple ground planes can be adjacent in the z dimension, and could thereby constitute a single ground plane with multiple stages. Ground plane 304 can be termed a "near" ground plane and ground plane 306 can be termed a "far" ground plane, referencing these planes' respective proximities to device layer(s) 302.

Such ground planes 304, 306 can be floating or connected to other circuit components. In an example, ground plane 304 can provide ground connections to components in device layer(s) 302 whereas ground plane 306 can be floating. In another example, second ground plane 304 can be floating while first ground plane provides ground connections to components in device layer(s) 302. In a third example, both ground planes 304, 306 can be floating ground plane layers and device layer components receive ground connections from yet another ground plane (not shown) beneath the two illustrated ground planes. The connections from the first ground plane 306 in the second example or from the third ground plane in the third example can be provided as conductive tunnels through the centers of voids in the floating ground plane 304 (in the second example) or both ground planes 304, 306 (in the third example). Any void can provide a through-via through a ground plane that can permit conductive passage from one side of the ground plane to the other, insulated from the ground plane, by making the insulative void donut-shaped (i.e., annular) and filled in the center with a superconducting metal. Providing a void with a conductive through-via does not decrease the effectiveness of the electrical functioning of the void in performing flux sequestering.

A wiring layer can also be provided between two ground planes to provide enhanced wiring density. Owing to the functioning of the fringe field, in such an arrangement, wires can be laid out much closer to voids than in an arrangement having only one ground plane, or otherwise not having the wiring between ground planes.

Figure 4:
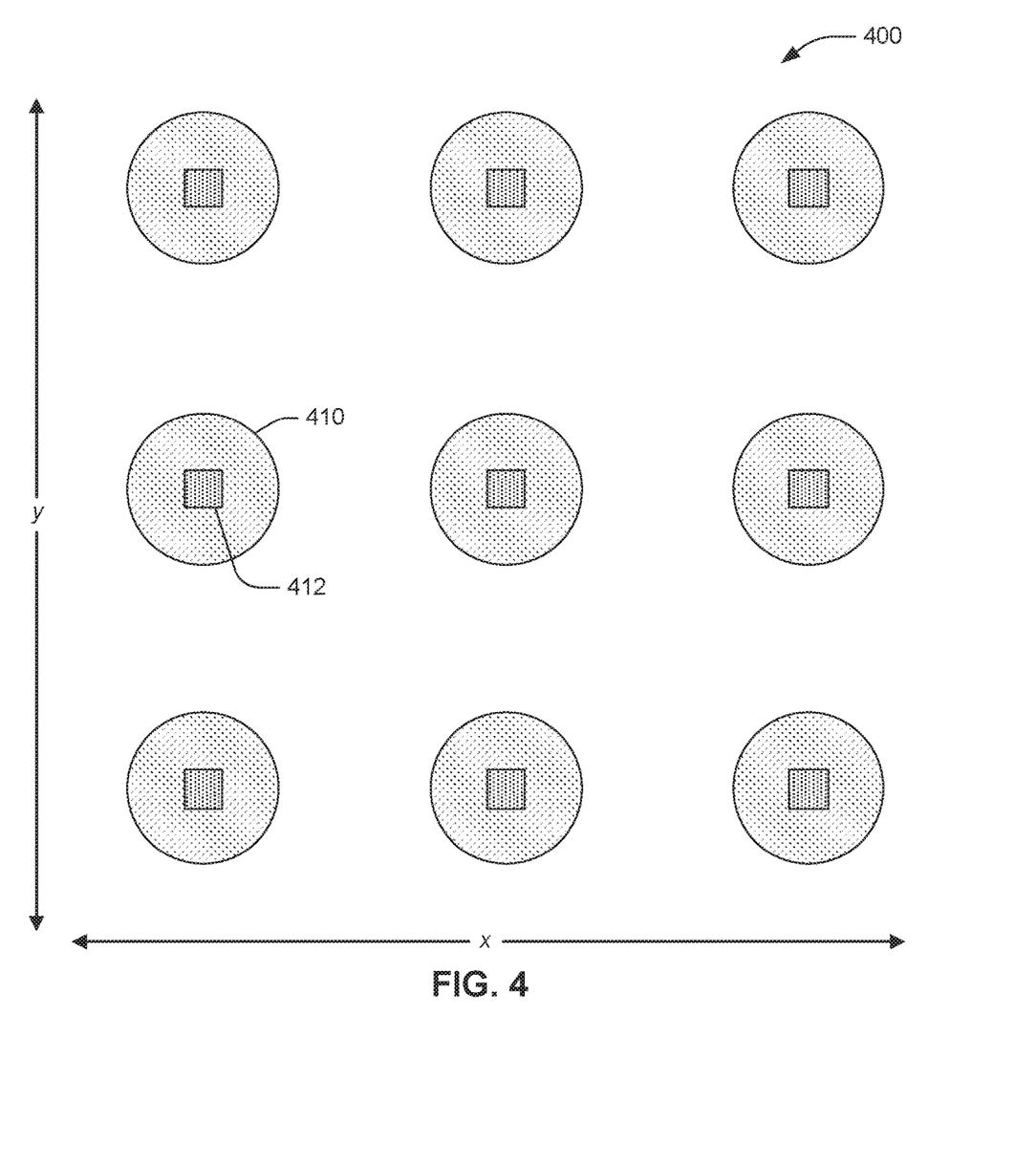
FIG. 4 is an x-y-plane void pattern diagram showing example grid patterns for multiple void-patterned superconducting ground planes.

Grids 310, 312 can be of the same geometric arrangement and the same minimum center-to-center void spacing $d_v$, and can align with each other, as better shown in the plan view of FIG. 4. The two or more ground planes 306, 304, etc. can be configured to complete cooldown successively, e.g., by providing the ground planes with different critical temperatures, such that a lower ground plane with larger voids (e.g., first ground plane 306) goes superconducting prior to a higher ground plane with smaller voids (e.g., second ground plane 304) during cooldown.

In FIG. 3, each ground plane 304, 306 can be fabricated at least in part as a blanket deposition, over an x-y plane, of a superconducting metal, and can, for example, have a z-dimension thickness of between about two hundred nanometers and about three hundred nanometers. Each ground plane 304, 306 is patterned in the x-y plane with a respective regular grid 312, 310 of dielectric-filled flux-trapping voids. As used herein, the term "dielectric-filled" means at least partially dielectric filled, and does not necessarily mean that the voids are completely filled with dielectric material; in particular, as described herein, the voids can be shaped to be annular, with a through-via that can have a superconductive core.

As discussed previously, in some examples, each void in grids 312, 310 can have a low aspect ratio. As an example, each void in grids 312, 310 can have an aspect ratio of less than 2:1 in any direction on the x-y plane. For example, each void in grids 312, 310 can have an aspect ratio of substantially 1:1. In some examples, voids in grids 310, 312 can be generally radially symmetrical. For example, each void in grids 312, 310 can be a regular polygon, e.g., a triangle, a square, a pentagon, a hexagon, an octagon, a circle, or a star.

The voids of successive ground planes 304, 306 can have a pyramidal arrangement with respect to the z dimension, that is, the voids of a ground plane (e.g., ground plane 304) that is closer to the device layer(s) 302 in the z dimension can be stacked on top of, roughly concentric with (in the x-y dimensions), and smaller in area than the voids of a next ground plane (e.g., ground plane 306) that is further from the device layer(s) 302 in the z dimension. By "roughly concentric," it is meant that there may be some amount of misalignment in the z-dimension axes of stacked voids of successive ground planes consistent with fabrication tolerances, but in no case so much that the periphery of a smaller void extends beyond the periphery of a larger void on a different ground plane in the x-y dimensional view.

In the superconducting IC 300 of FIG. 3, the circuit devices are placed and the interconnecting wires are routed, in a plan view of the x-y plane, in the intervoid space of the patterned ground plane nearest to the device layer(s) 302, i.e., between the voids 312 as viewed from a plan view but not necessarily in the same plane as the voids 312, since the voids are in the ground plane 304 and the devices and wires are in other layer(s) 302. The devices are placed and interconnecting wires are routed such that the devices and wires do not intersect any of the voids (as viewed in the plan view) and maintain a predetermined distance away from each of the voids (as viewed in the plan view). The devices and wires form at least one active digital circuit. The voids are configured to protect the at least one active digital circuit from parasitic flux bias by attracting and sequestering stray flux such that it cannot couple flux to the devices or wires.

In some examples, a maximum x-y dimension of each void (e.g., a maximum diameter of each void) in a grid on a layer nearest to device layer(s) 302 (e.g., layer 304 as illustrated) is less than or equal to a maximum distance from a possible stray location on the ground plane to a nearest void edge. In some examples, the maximum x-y dimension of each void in the grid on the layer nearest to device layer(s) 302 (e.g., layer 304 as illustrated) is between about one fifth of a micrometer and about five micrometers, e.g., about three micrometers, whereas the maximum x-y dimension of each void in the grid on a lower layer (e.g., layer 306 as illustrated) is between about five micrometers and about fifteen micrometers, e.g., about ten micrometers. In some examples, the maximum distance from a possible stray location on the ground plane to a nearest void edge in the nearest layer (e.g., layer 304) is between about ten micrometers and about fourteen micrometers, e.g., about twelve micrometers.

FIG. 4 supplements FIG. 3 in illustrating how effective void patterning geometries can be applied sequentially to multiple ground planes or to a single ground plane with multiple stages, each ground plane having a different void pattern, as described above with respect to FIG. 3. The plan view of FIG. 4 illustrates multiple ground plane void patterning geometries in which two or more ground planes act in concert to sequester flux in the voids. Two or more ground planes can be configured to complete cooldown successively, e.g., by fabricating the ground planes to have different critical temperatures, such that a lower ground plane (e.g., corresponding to first ground plane 306 of FIG. 3) with larger voids 410 goes superconducting prior to a higher ground plane (e.g., corresponding to second ground plane 304 of FIG. 3) with smaller voids 412 during cooldown. An example patterning geometry 400 is illustrated in FIG. 4, showing larger voids 410 on a lower, earlier-to-cool ground plane layer (e.g., corresponding to first ground plane 306 of FIG. 3) and concentrically aligned, smaller voids 412 on a higher, later-to-cool ground plane layer (e.g., corresponding to second ground plane 304 of FIG. 3). Although only two ground plane layers are shown in FIGS. 3 and 4, similar arrangements can have more than two ground plane layers, e.g., three ground plane layers with successively smaller voids, or four ground plane layers with successively smaller voids. As an alternative to having voids in multiple different ground plane layers, multiple sets of voids can be fabricated in a single ground plane layer having two or more superconductor transition temperatures, which achieves the same effect. FIG. 4 illustrates the larger voids 410 in the lower, sooner-to-superconduct ground plane as circular and the smaller voids 412 in the upper, later-to-superconduct ground plane as square, but either set of voids can take on any appropriate low-aspect-ratio shape, as described previously.

When, during cooldown, the two (or more) ground planes go superconducting sequentially, from lower to upper ground planes (i.e., from ground planes further from the device layer(s) toward those closer to the device layer(s)), the configuration of FIGS. 3 and 4 can sequester flux in stages. The larger, lower-layer voids 410 can meet the criteria described earlier with respect to FIG. 2, i.e., $D_v \leq D_s$. All residual flux is initially sequestered in these voids 410. Then, as a higher ground plane subsequently goes superconducting, the only strays that the smaller voids 412 of the higher ground plane have to attract are already within the respective flux collection ranges of these smaller voids 412. Despite their smaller size, voids 412 are still large enough to attract any flux within the area of the larger voids 410. The void arrangement of FIGS. 3 and 4 effectively permits for smaller voids that are spaced further apart from each other than they would otherwise be allowed to be, while still remaining effective at flux sequestration, thereby providing more x-y plane intervoid space for devices and wires to be placed in one or more device layer(s).

The lower superconducting ground plane having larger voids 410 can be made to go superconducting earlier either because it is made of a different material, e.g., a different variety of niobium or a different superconducting metal, or by using a mechanical/physical manipulation to vary the critical transition temperature of the metal. Examples of such mechanical/physical manipulation include applying the ground plane metal at a different anneal temperature, adjusting the thickness of ground plane, or doping of the ground plane. Another way of cooling a first ground plane below its critical temperature before cooling a second ground plane below its (same or different) critical temperature is to apply refrigeration to the first ground plane before applying the refrigeration to the second ground plane.

Figure 5:
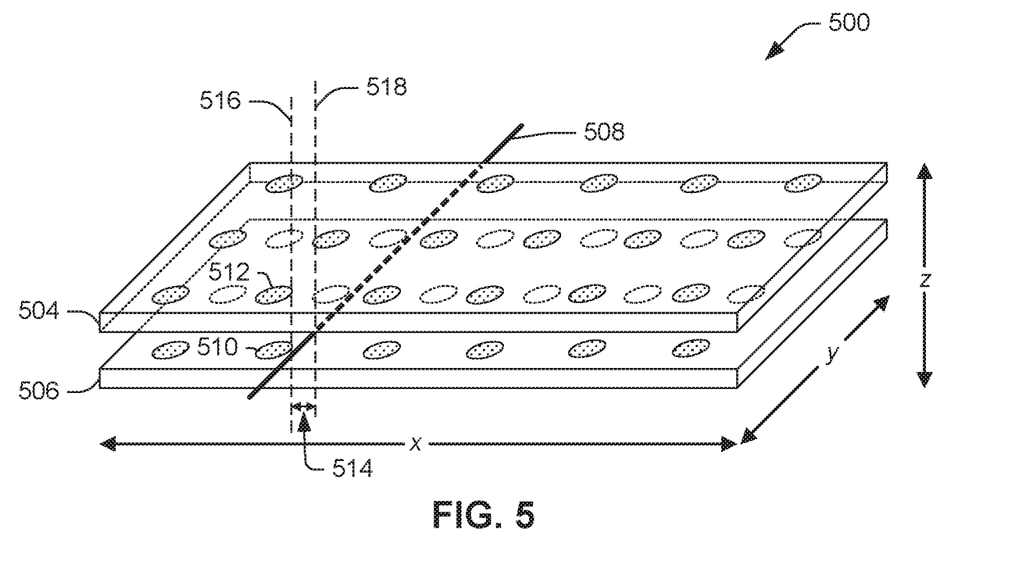
FIG. 5 is a cabinet projection illustration of two patterned ground planes sandwiching a wiring layer.

FIG. 5 illustrates an example ground plane arrangement 500 wherein a wiring layer is provided between two ground planes 504, 506 to provide enhanced wiring density. Wires in the wiring layer, as represented in FIG. 5 by wire 508, are permitted to be placed more closely to voids 510, 512 by virtue of being sandwiched between two void-patterned ground planes 504, 506. The dimensions and separation between the ground planes 504, 506 may be exaggerated for purposes of illustration. Ground plane 506 is patterned with voids 510 while ground plane 504 is patterned with voids 512. As described previously, other layers may also be provided, such as a device layer (not illustrated in FIG. 5) above the ground planes. Ground planes 504, 506 may be floating or connected to other circuit components. Owing to the functioning of the fringe field, in the arrangement 500, the predefined minimum placement distance 514 which wire 508 is permitted to be with respect to any void 510, 512, i.e., between edge 516 of void 510 or void 512 and placement of wire 518, can be smaller than in an arrangement having only one ground plane, or otherwise not having the wiring between ground planes.

Figure 6:
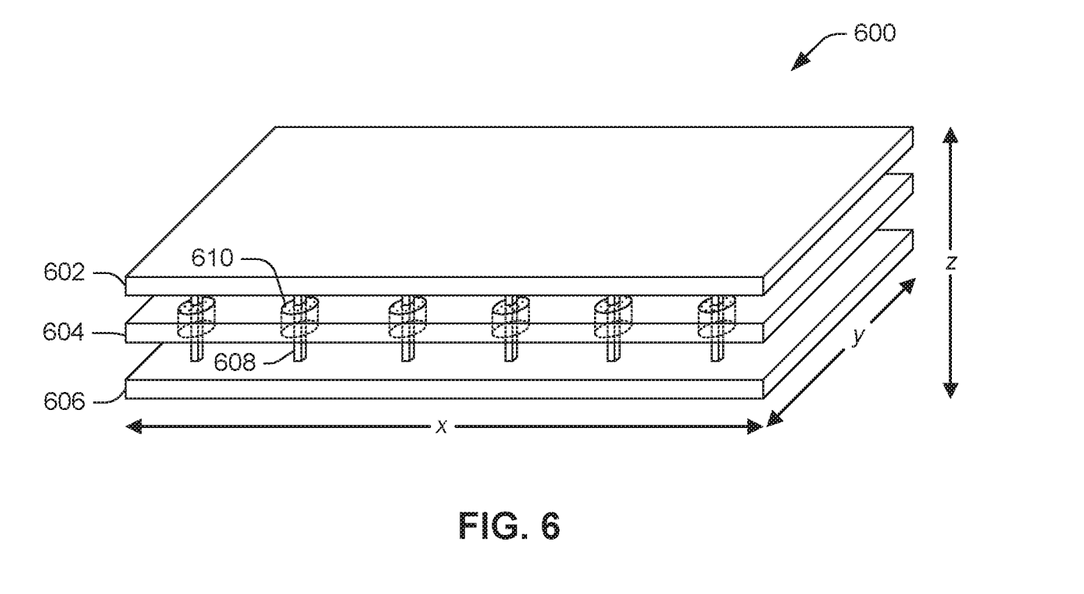
FIG. 6 is a cabinet projection illustration of wiring running from a lower ground plane to an upper device layer through donut-shaped voids in an intermediate ground plane, which can be a floating ground plane.

FIG. 6 illustrates an example arrangement 600 wherein superconducting-metal electrical connections 608 from a first ground plane 606 are provided to a device layer 602 as conductive tunnels through the centers of annular or donut-shaped voids 610 in an intermediate ground plane 604, which intermediate ground plane 604 can be floating with respect to the other layers 602, 606. As with FIG. 5, the dimensions and separation between layers may be exaggerated for purposes of illustration. In FIG. 6, all illustrated voids provide through-vias for superconductive passages 608 from one side of intermediate ground plane 604 to the other, the superconductive passages 608 being insulated from intermediate ground plane 604, but in other examples fewer than all of the vias can provide through-holes (i.e., some of them may be solid dielectric and not annular). The flux-trapping effectiveness of voids 610 is not reduced by providing them with through-vias. In some examples, not specifically shown but combining aspects of the examples of FIGS. 5 and 6, annular voids in an intermediary ground plane can provide connections from wires or devices in the upper device layer(s) to wires in a wiring layer below the intermediary ground plane.

Figure 7:
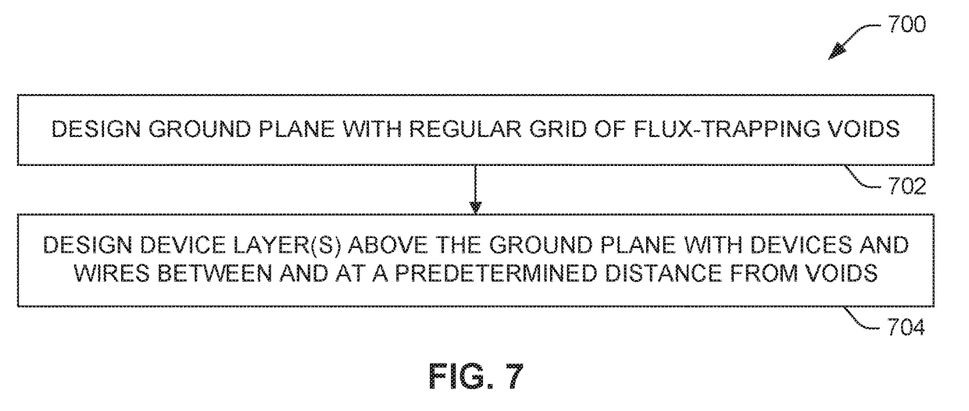
FIG. 7 is a flow chart illustrating an example method of designing a superconducting IC with a void-patterned ground plane.

FIG. 7 illustrates an example method 700 of designing a superconducting IC with a void-patterned ground plane. A ground plane is designed 702 as patterned in an x-y plane with a regular grid of dielectric-filled, flux-trapping voids. Each void in the grid has an aspect ratio of less than 2:1 in any direction on the x-y plane. The design 702 is performed at least in part by selecting a maximum x-y dimension of each void in the grid as less than or equal to a maximum distance from a possible stray location on the ground plane to a nearest void edge. As discussed previously, each void need not be completely dielectric-filled, but can be annular in shape to provide a through-via without detriment to its flux-trapping effectiveness. After designing the patterned ground plane, one or more layers above the ground plane can be designed 704 to have more than one thousand discrete circuit devices interconnected by superconducting wires, at least in part by choosing the placement of the devices and the routing of the wires, in a plan view of the x-y plane, such that the devices and wires do not intersect any of the voids and maintain a predetermined distance away from each of the voids. The devices and wires form at least one active digital circuit.

Figure 8:
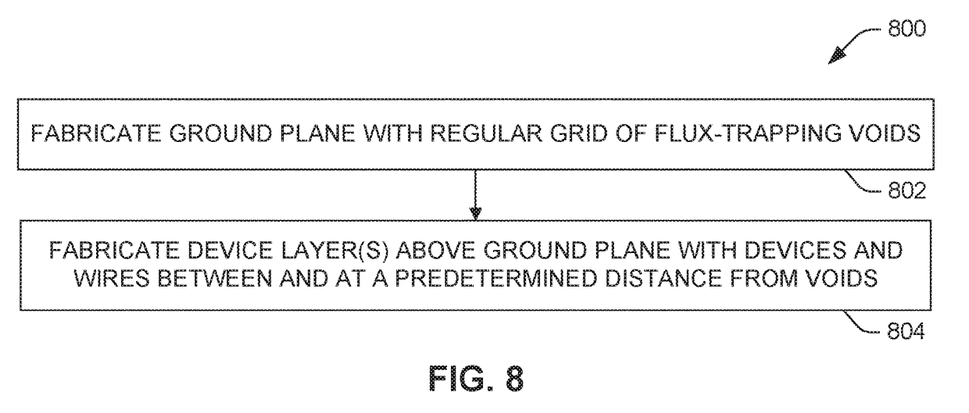
FIG. 8 is a flow chart illustrating an example method of fabricating a superconducting IC with a void-patterned ground plane.

FIG. 8 illustrates an example method 800 of fabricating a superconducting IC with a void-patterned ground plane. A ground plane is fabricated 802 to be patterned in an x-y plane with a regular grid of dielectric-filled, flux-trapping voids, each void in the grid having an aspect ratio of less than 2:1 in any direction on the x-y plane, at least in part by fabricating each void in the grid as having a maximum x-y dimension less than or equal to a maximum distance from a possible stray location on the ground plane to a nearest void edge. As discussed previously, each void need not be completely dielectric-filled, but can be annular in shape to provide a through-via without detriment to its flux-trapping effectiveness. After fabricating 802 the patterned ground plane, one or more layers above the ground plane can be fabricated 804 to have more than one thousand discrete circuit devices interconnected by superconducting wires, the devices being placed and wires being routed, in a plan view of the x-y plane, between the voids, such that the devices and wires do not intersect any of the voids and maintain a predetermined distance away from each of the voids, the devices and wires forming at least one active digital circuit.

The layout and fabrication methods illustrated in FIGS. 7 and 8 involve putting down a grid of voids first, and then laying out circuit components and wiring around the voids, treating the voids as blockages. This differs from less regimented conventional approaches in which circuit layout would precede the layout of long, skinny, serpentine moats around the devices and wiring, where space permitted, which approach has not been made successfully to scale to many thousands of devices.

The ground-plane-patterned circuit devices and the ground-plane-patterning methods described herein have a number of advantages over prior approaches to dealing with fluxes. While conventional approaches laid out circuit structures and then surrounded them with moats or other voids, the approaches embodied by the circuits and methods described herein first lay out a grid of flux-sequestering voids in the x-y-plane, and thereafter arrange circuit components and wires in the resulting intervoid space. As such, this disclosure presents an entirely new approach to superconducting circuit layout design and fabrication. At the same time, the circuits and methods described herein completely eliminate flux trapping in very-large-scale circuits (i.e., circuits of more than a thousand devices) while minimizing area reserved for void patterning, and maximizing x-y routing resources (i.e., space available for device and wire placement in the circuit layout). The circuits and methods described herein offer higher effectiveness and lower cost functions than approaches that use moats or milliohm resistances.

Unlike conventional moat geometries that are fully effective at sequestering flux but that are not amenable to the x-y routing required in IC design because the moats are elongated in one dimension to the point where they are larger than the spacing between them, the presently described circuits and methods permit simplified x-y wire-up in the intervoid space, particularly when square patterning geometries are used. Also, unlike conventional moat geometries that use moat spacings that are too large to produce fully effective sequestering, the circuits and methods described herein can completely eliminate flux trapping in very-large-scale circuits. Still further, unlike approaches that may involve a partially regular ground plane patterning, the regularity of which is interrupted for placement of one or more comparatively large passive components such as resonators, the devices and methods of the present application work to protect one or more active digital circuits from parasitic flux bias by implementing a truly regular grid, i.e., one the regularity of which is uninterrupted for component placement, by placing the active digital circuit elements and connecting wires only between flux-sequestering voids (when viewed in the plan view of the circuit).

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting digital integrated circuit (IC) comprising:
   a ground plane fabricated at least in part as a blanket deposition of a superconducting metal, the ground plane being patterned with a regular grid of dielectric-filled flux-trapping voids, each void in the grid being generally radially symmetrical in shape; and
   discrete circuit devices interconnected by superconducting wires fabricated on one or more device layers above the ground plane, the devices being placed and wires being routed between individual voids in the regular grid, such that the devices and wires do not intersect any of the voids and maintain at least a predetermined distance away from any of the voids, the devices and wires forming at least one active digital circuit;
   wherein the voids are configured to protect the at least one active digital circuit from parasitic flux bias by attracting and sequestering stray flux such that it cannot couple flux to the devices or wires.

2. The IC of claim 1, wherein the ground plane has a thickness of between about twenty nanometers and about one thousand nanometers.

3. The IC of claim 1, wherein a maximum dimension of each void in the grid is less than or equal to a maximum distance from a possible stray location on the ground plane to a nearest void edge.

4. The IC of claim 3, wherein a maximum dimension of each void in the grid is between about one-fifth of a micrometer and about ten micrometers, and wherein the maximum distance from a possible stray location on the ground plane to a nearest void edge is between about one-half of a micrometer and about ten micrometers.

5. The IC of claim 3, wherein the minimum center-to-center spacing between voids is between about five micrometers and about twenty micrometers.

6. The IC of claim 1, wherein the ground plane is a second ground plane, the IC further comprising a first superconducting ground plane located beneath the second ground plane, on the other side of the second ground plane from the one or more device layers.

7. The IC of claim 6, wherein at least one of the flux-trapping voids of the second ground plane is annular to provide a superconductive-metal-filled through-via that either superconductively connects at least one of the one or more device layers and the first ground plane or superconductively connects at least one of the one or more device layers and a wiring layer located between the first and second ground planes.

8. The IC of claim 6, wherein the first ground plane is patterned with dielectric-filled flux-trapping voids, and wherein at least some of the voids of the first ground plane are each concentric with a corresponding flux-trapping void of the second ground plane.

9. The IC of claim 8, having a wiring layer between the first and second ground planes.

10. The IC of claim 8, wherein for at least some of the voids of the second ground plane having a corresponding concentric void of the first ground plane, the maximum dimension of each second-ground-plane void is less than the maximum dimension of its corresponding first-ground-plane void.

11. The IC of claim 8, wherein each second-ground-plane void having a larger corresponding first-ground-plane void has a maximum dimension between about one fifth of a micrometer and about five micrometers, and wherein each first-ground-plane void having a smaller corresponding second-ground-plane void has a maximum dimension between about five micrometers and about fifteen micrometers.

12. The IC of claim 11, wherein the maximum distance from a possible stray location on the ground plane to a nearest void edge in the nearest layer is between about ten micrometers and about fourteen micrometers.

13. The IC of claim 10, wherein the first ground plane is configured to become superconducting before the second ground plane during cryogenic cooldown of the IC.

14. The IC of claim 13, wherein the first ground plane has a higher critical temperature than the second ground plane.

15. A method of fabricating a superconducting digital integrated circuit (IC) comprising:
fabricating a ground plane patterned with a regular grid of dielectric-filled flux-trapping voids, each void in the grid being generally radially symmetrical in shape, at least in part by fabricating each void in the grid as having a maximum dimension less than or equal to a maximum distance from a possible stray location on the ground plane to a nearest void edge; and
fabricating one or more device layers above the ground plane to have discrete circuit devices interconnected by superconducting wires, the devices being placed and wires being routed between individual voids in the regular grid, such that the devices and wires do not intersect any of the voids and maintain at least a predetermined distance away from each of the voids, the devices and wires forming at least one active digital circuit;
wherein the voids are configured to protect the at least one active digital circuit from parasitic flux bias by attracting and sequestering stray flux such that it cannot couple flux to the devices or wires.

16. The method of claim 15, wherein the ground plane is fabricated such that a maximum dimension of each void in the grid is between about one-fifth of a micrometer and about ten micrometers, and wherein the maximum distance from a possible stray location on the ground plane to a nearest void edge is between about one-half of a micrometer and about ten micrometers.

17. The method of claim 15, wherein the ground plane is a near ground plane, the method further comprising fabricating a far superconducting ground plane patterned with flux-trapping voids at least some of which are concentric with corresponding voids in the near ground plane, the far ground plane being configured to become superconducting prior to the near ground plane during cryogenic cooldown of the IC, the far ground plane being located on the other side of the near ground plane from the one or more device layers,
wherein each near-ground-plane void having a larger corresponding far-ground-plane void has a maximum dimension between about one fifth of a micrometer and about five micrometers,
wherein each far-ground-plane void having a smaller corresponding near-ground-plane void has a maximum dimension between about five micrometers and about fifteen micrometers, and
wherein the maximum distance from a possible stray location on the ground plane to a nearest void edge in the nearest layer is between about ten micrometers and about fourteen micrometers.

18. A superconducting digital integrated circuit (IC) comprising:
first and second ground planes each fabricated at least in part as a blanket deposition of a superconducting metal and each being patterned with a regular grid of dielectric-filled flux-trapping voids, at least some of the voids of the second ground plane each having a corresponding concentric void of the first ground plane, the maximum dimension of each second-ground-plane void being less than the maximum dimension of the corresponding first-ground-plane void; and
one or more device layers above the ground planes, the one or more device layers comprising discrete circuit devices interconnected by superconducting wires, the devices being placed and wires being routed between individual voids in the regular grid, such that the devices and wires do not intersect any of the voids and maintain at least a predetermined distance away from any of the voids, the devices and wires forming at least one active digital circuit;
wherein the voids are configured to protect the at least one active digital circuit from parasitic flux bias by attracting and sequestering stray flux such that it cannot couple flux to the devices or wires.

19. The IC of claim 18, further comprising a wiring layer between the ground planes, the wiring layer comprising wires routed between individual voids in the regular grids of the ground planes.

20. The IC of claim 19, wherein at least one of the flux-trapping voids of the second ground plane is annular to provide a superconductive-metal-filled through-via that either superconductively connects at least one of the one or more device layers and the first ground plane or superconductively connects at least one of the one or more device layers and the wiring layer.

* * * * *